(12) United States Patent
Dessart

(10) Patent No.: US 10,925,194 B2
(45) Date of Patent: Feb. 16, 2021

(54) DUAL CHAMBER WIND TUNNELS FOR A WELDING-TYPE POWER SOURCE

(71) Applicant: ILLINOIS TOOL WORKS INC., Glenview, IL (US)

(72) Inventor: Nicholas James Dessart, Appleton, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 464 days.

(21) Appl. No.: 15/908,405

(22) Filed: Feb. 28, 2018

(65) Prior Publication Data

US 2019/0269044 A1 Aug. 29, 2019

(51) Int. Cl.
*H05K 7/20* (2006.01)
*B23K 37/00* (2006.01)
*B23K 9/10* (2006.01)

(52) U.S. Cl.
CPC ....... *H05K 7/20918* (2013.01); *B23K 9/1006* (2013.01); *B23K 37/003* (2013.01)

(58) Field of Classification Search
CPC ........... H05K 7/20918; H05K 7/20909; H05K 7/2089; H05K 7/20754; B23K 37/003; B23K 9/1006; B23K 37/00
USPC ........... 219/130.1, 136, 56; 165/58, 59, 172, 165/174; 361/695, 694, 690, 691, 692, 361/697, 714
See application file for complete search history.

(56) References Cited

U.S. PATENT DOCUMENTS

| | | |
|---|---|---|
| 5,642,260 A | 6/1997 | Sigl |
| 6,489,591 B1 | 12/2002 | Achtner |
| 6,803,541 B2 | 10/2004 | Andersen et al. |
| 6,888,099 B1 * | 5/2005 | Schneider .......... H05K 7/20918 219/130.1 |
| 7,429,712 B2 * | 9/2008 | Stanzel ................ B23K 9/1006 219/130.1 |

(Continued)

FOREIGN PATENT DOCUMENTS

| | | |
|---|---|---|
| AT | 14905 | 8/2016 |
| EP | 2364807 | 9/2011 |

OTHER PUBLICATIONS

International Searching Authority, "International Search Report and Written Opinion," issued in connection with International Patent Application No. PCT/US2019/019594, dated Jul. 16, 2019, 14 pages.

*Primary Examiner* — David J Walczak
(74) *Attorney, Agent, or Firm* — McAndrews, Held & Malloy, Ltd.

(57) ABSTRACT

A wind tunnel for a welding-type power supply has a primary section and a secondary section that combine to produce a primary cooling chamber and a secondary cooling chamber. Baffling on the primary and secondary sections define primary and secondary airflow paths through the primary and secondary cooling chambers. Fans may be configured to drive air along the airflow paths, and electrical components situated in the cooling chambers may be cooled by air flowing along the airflow paths. A divider comprising engaged partitions of the primary section and secondary section may separate and/or isolate the primary cooling path from the secondary cooling path. The wind tunnel may comprise an insulating material to provide electrical isolation (creepage and clearance) between electrical components.

20 Claims, 13 Drawing Sheets

(56) References Cited

U.S. PATENT DOCUMENTS

| | | | |
|---|---|---|---|
| 7,456,373 B2 * | 11/2008 | Andersen | B23K 9/32 |
| | | | 219/130.1 |
| 7,868,588 B2 | 1/2011 | Altekruse et al. | |
| 8,243,447 B2 * | 8/2012 | Fujiki | H05K 7/20918 |
| | | | 361/695 |
| 8,462,505 B2 | 6/2013 | Nagami et al. | |
| 10,285,305 B2 * | 5/2019 | Yang | H05K 7/20163 |
| 2005/0029241 A1 | 2/2005 | Miao Spear | |
| 2007/0034617 A1 | 2/2007 | Oyama et al. | |
| 2008/0061046 A1 | 3/2008 | Borowy et al. | |
| 2008/0061047 A1 | 3/2008 | Borowy et al. | |
| 2016/0129517 A1 | 5/2016 | Altekruse et al. | |

* cited by examiner

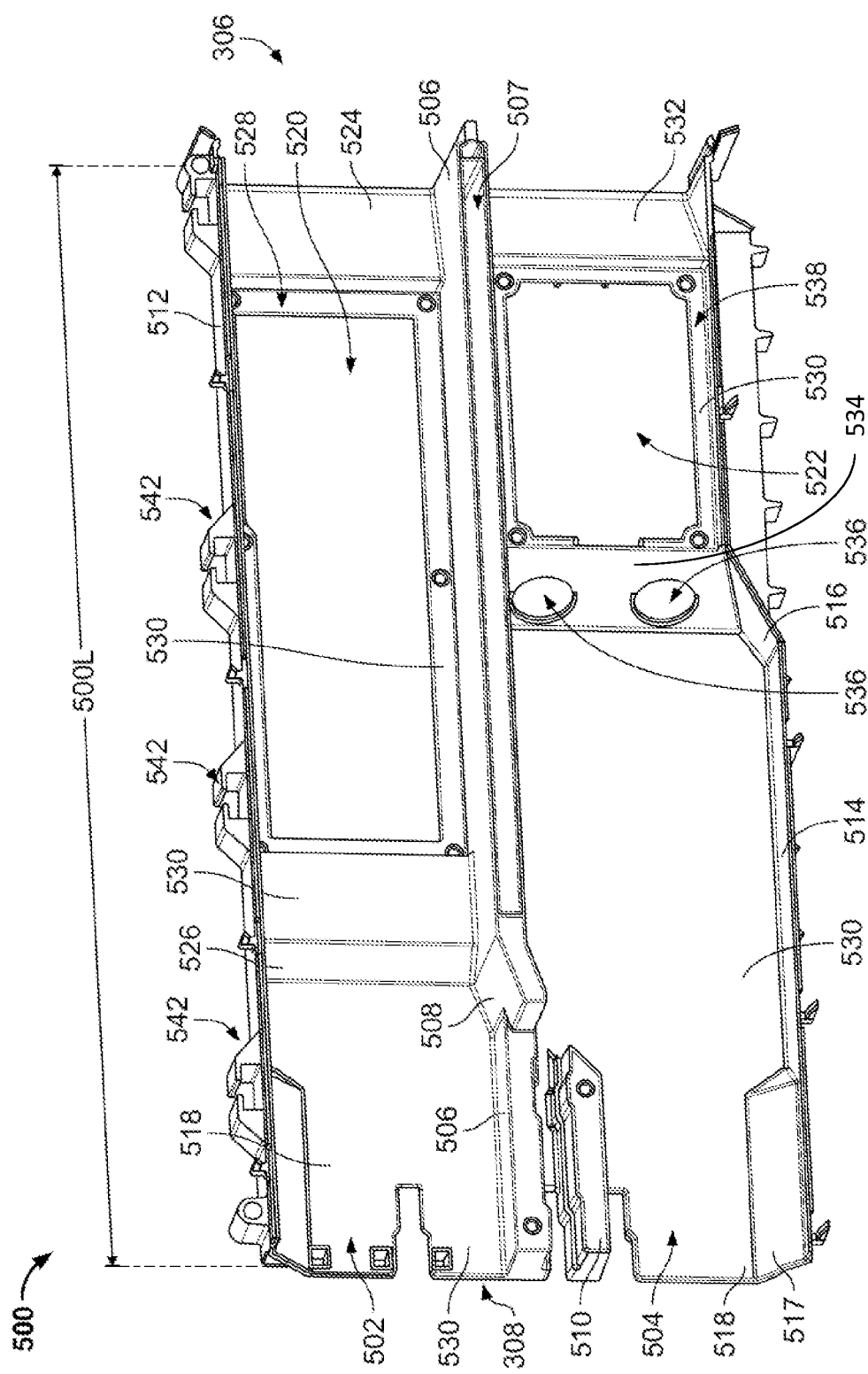

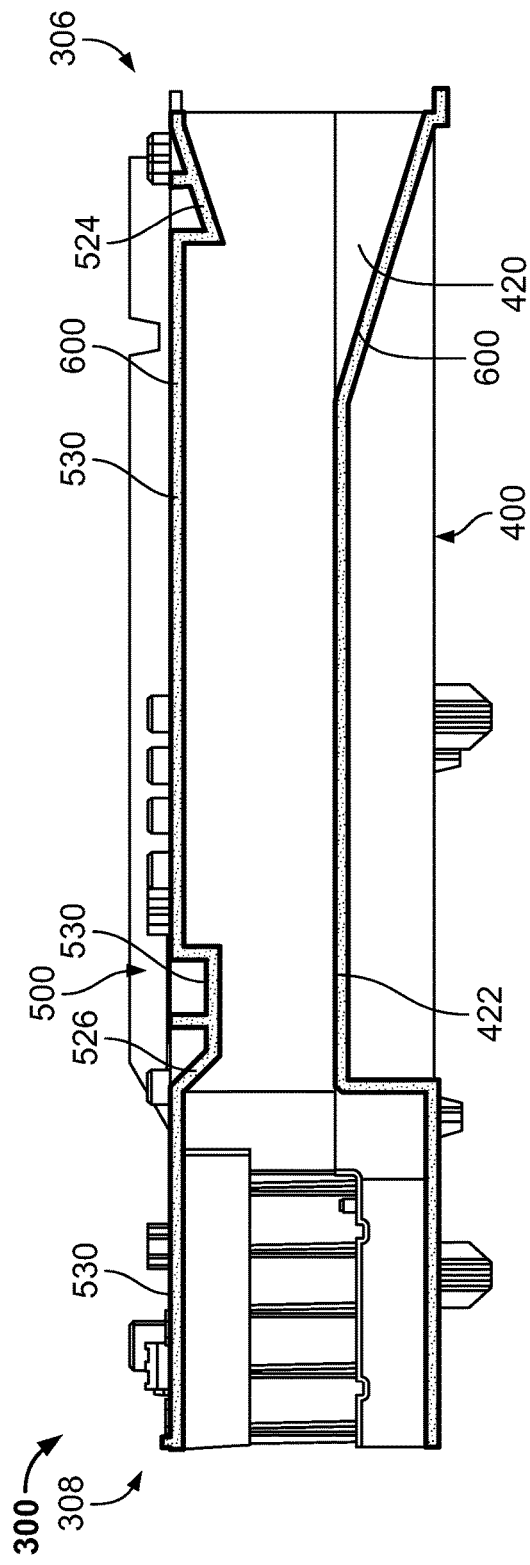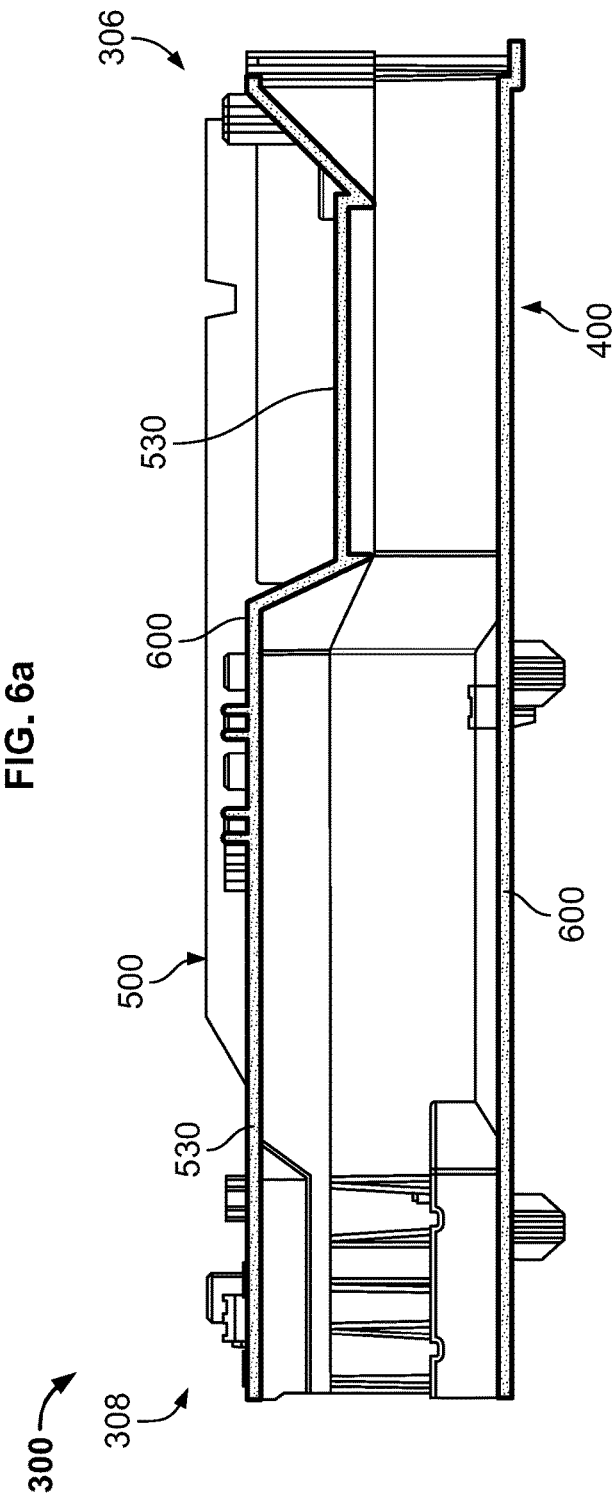
FIG. 6a
FIG. 6b

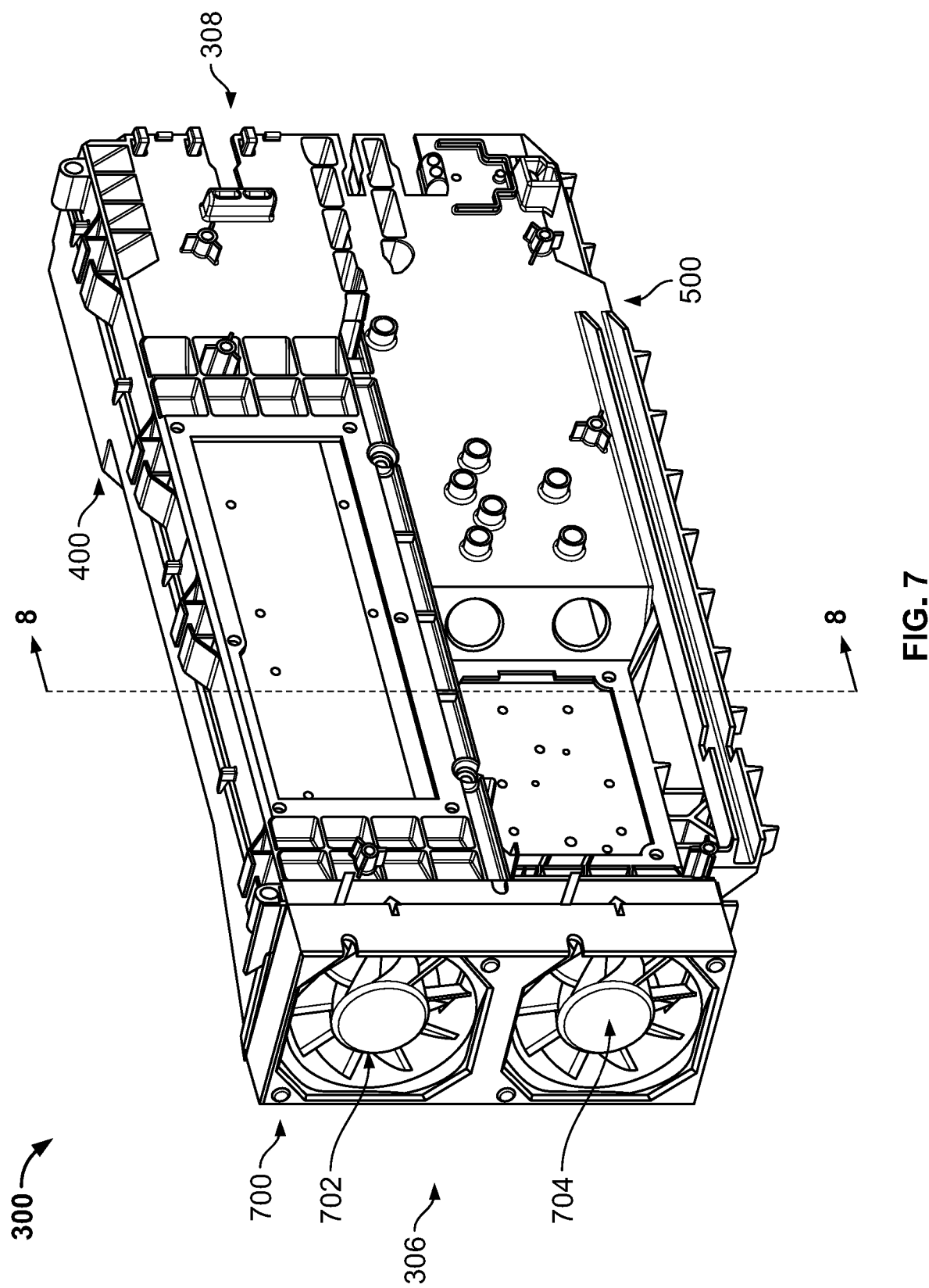

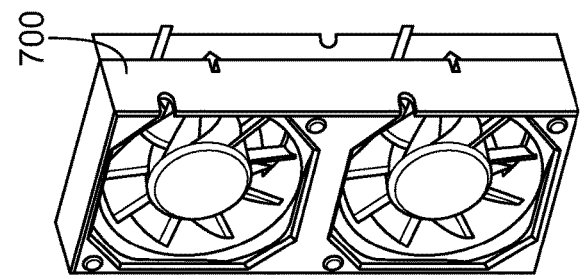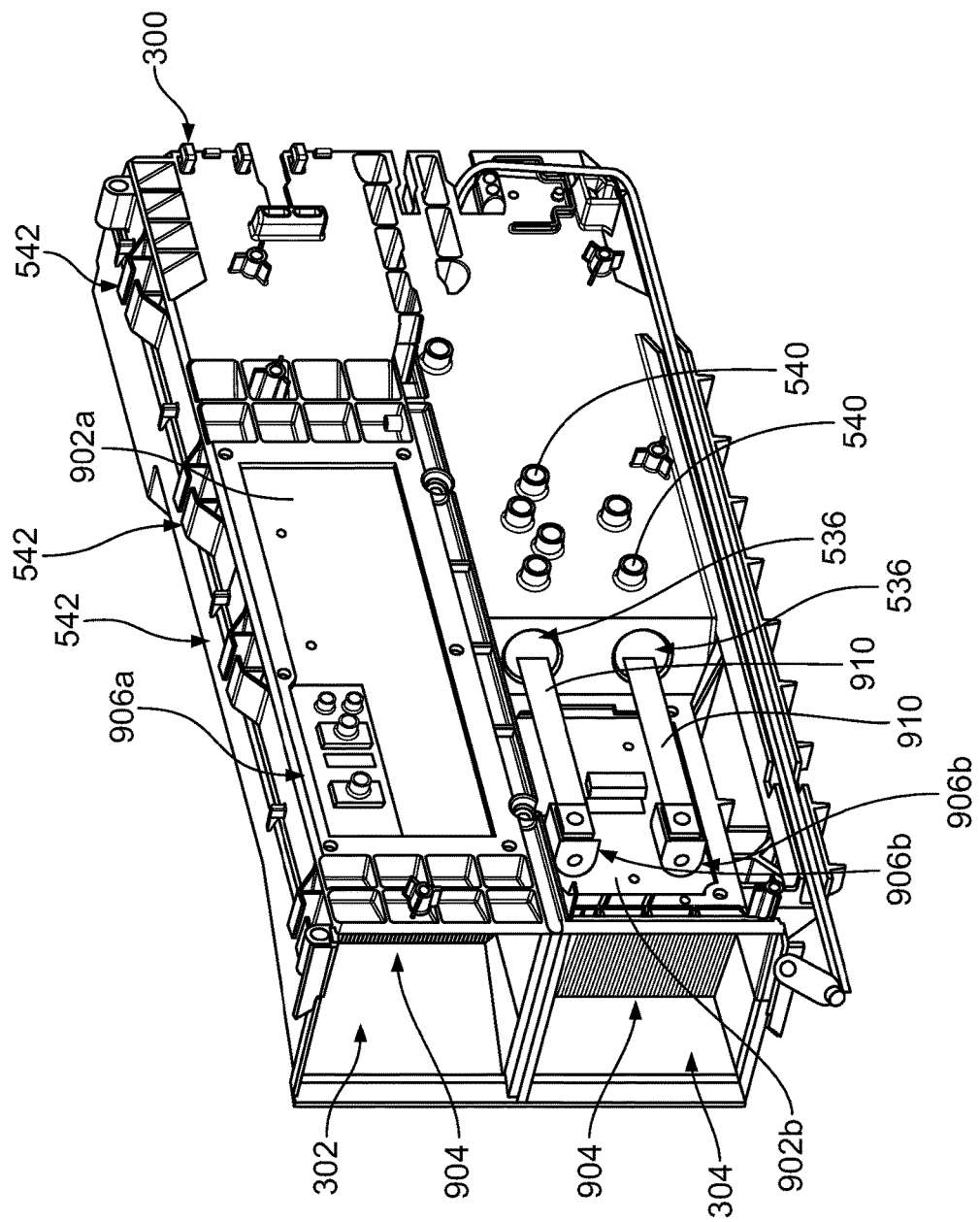
FIG. 12a

DUAL CHAMBER WIND TUNNELS FOR A WELDING-TYPE POWER SOURCE

TECHNICAL FIELD

The present disclosure generally relates to a welding-type power source, and, more particularly, to dual chamber wind tunnels for a welding-type power source.

BACKGROUND

Welding-type power sources contain numerous electrical components. The electrical components generate non-trivial amounts of heat that must be managed and/or dissipated to prevent damage to the electrical components. Additionally, the welding-type power sources have spacing requirements that must be met for cooling and/or electrical isolation of the electrical components.

BRIEF SUMMARY

Systems and methods are provided for a dual chamber wind tunnel for a welding-type power source, substantially as shown in and/or described in connection with at least one of the figures, as set forth more completely in the claims.

These and other advantages, aspects and novel features of the present invention, as well as details of an illustrated example thereof, will be more fully understood from the following description and drawings.

BRIEF DESCRIPTION OF THE DRAWINGS

FIG. 5 is an example secondary section of the wind tunnel of FIG. 3, in accordance with aspects of this disclosure.

FIG. 6a is a top plan view of the example wind tunnel of FIG. 3, in accordance with aspects of this disclosure.

FIG. 6b is a bottom plan view of the example wind tunnel of FIG. 3, in accordance with aspects of this disclosure.

FIG. 7 is a perspective view of the example wind tunnel of FIG. 3 coupled to a fan cassette, in accordance with aspects of this disclosure.

FIG. 12a is a perspective view of the example wind tunnel of FIG. 3 assembled with heat sinks and showing an arrangement of an associated fan cassette, in accordance with aspects of this disclosure.

The figures are not necessarily to scale. Similar or identical reference numerals may be used to refer to similar or identical components.

DETAILED DESCRIPTION OF THE INVENTION

Figure 1:
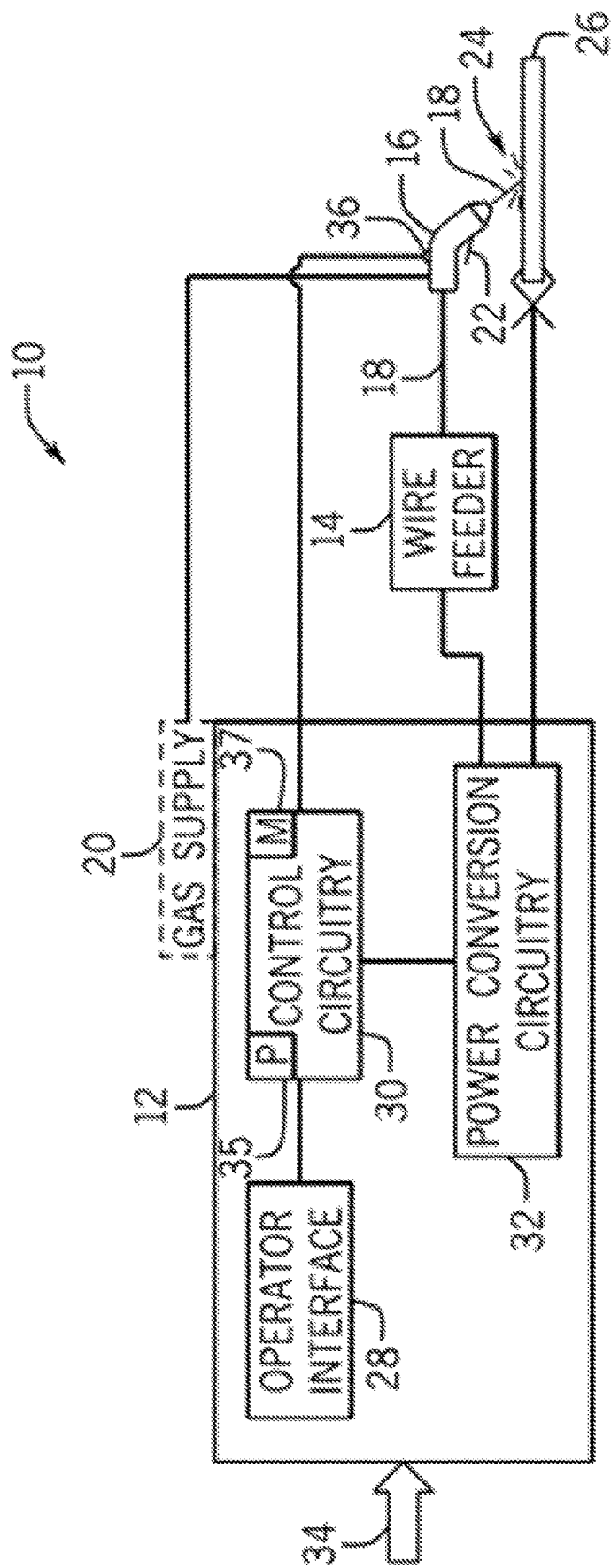
FIG. 1 is an example of a welding system, in accordance with aspects of this disclosure.

Preferred examples of the present disclosure may be described hereinbelow with reference to the accompanying drawings. In the following description, well-known functions or constructions are not described in detail because they may obscure the disclosure in unnecessary detail. For this disclosure, the following terms and definitions shall apply.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z".

As utilized herein, the term "exemplary" means serving as a non-limiting example, instance, or illustration. As utilized herein, the terms "e.g.," and "for example" set off lists of one or more non-limiting examples, instances, or illustrations.

The terms "coupled," "coupled to," and "coupled with" as used herein, each mean a structural and/or electrical connection, whether attached, affixed, connected, joined, fastened, linked, and/or otherwise secured. The term "attach" means to affix, couple, connect, join, fasten, link, and/or otherwise secure. The term "connect," means to attach, affix, couple, join, fasten, link, and/or otherwise secure.

The terms "about" and/or "approximately," when used to modify or describe a value (or range of values), position, orientation, and/or action, mean reasonably close to that value, range of values, position, orientation, and/or action. Thus, the embodiments described herein are not limited to only the recited values, ranges of values, positions, orientations, and/or actions but rather should include reasonably workable deviations.

As used herein, a welding-type power supply and/or power source refers to any device capable of, when power is applied thereto, supplying welding, cladding, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

Welding-type power, as used herein, refers to power suitable for welding, cladding, plasma cutting, induction heating, CAC-A and/or hot wire welding/preheating (including laser welding and laser cladding), carbon arc cutting or gouging, and/or resistive preheating.

Some examples of the present disclosure relate to a power supply enclosure, comprising a housing and a wind tunnel disposed within the housing. The wind tunnel may comprise a primary section having a first primary portion and a second primary portion separated by a primary partition, and a secondary section having a first secondary portion and a second secondary portion separated by a secondary partition. When the primary partition engages the secondary partition to couple the primary section to the secondary section, the first primary portion and first secondary portion combine to define a first cooling chamber, and the second primary portion and second secondary portion combine to define a second cooling chamber that is separated from the first cooling chamber by a divider comprising the engaged primary partition and secondary partition.

In some examples, the wind tunnel further comprises a first end coupled to a fan cassette, where the fan cassette comprises a first fan configured to generate airflow in the first cooling chamber and a second fan configured to generate airflow in the second cooling chamber. In some examples, the first cooling chamber comprises an airflow path between the first primary portion and the first secondary portion. In some examples, the second cooling chamber comprises an airflow path between the second primary portion and the second secondary portion. In some examples, the first cooling chamber and second cooling chamber are axially offset from one another proximate a window of the second cooling chamber. In some examples, the secondary partition comprises a channel, and wherein at least a portion of the primary partition is positioned within the channel when the primary partition and the secondary partition are engaged. In some examples, the secondary partition defines at least a portion of the first cooling chamber and second cooling chamber when the first partition and the second partition are engaged. In some examples, the wind tunnel further comprises baffling configured to direct air flow within at least one of the first cooling chamber or the second cooling chamber. In some examples, the first secondary portion comprises a window configured to accept a heat sink. In some examples, the second secondary portion comprises a window configured to accept a heat sink.

Some examples of the present disclosure relate to a welding power supply, comprising a housing, and a wind tunnel disposed within the housing. The wind tunnel comprises a primary section having a first primary portion and a second primary portion separated by a primary partition, a secondary section having a first secondary portion and a second secondary portion separated by a secondary partition, a first cooling chamber defined by the first primary portion, the first secondary, and a divider comprising the primary partition engaged to the secondary partition, and a second cooling chamber defined by the second primary portion, the second secondary portion, and the divider. The welding power supply further comprises first components positioned within the first cooling chamber, second components positioned within the second cooling chamber, a first fan configured to generate a first airflow across the first components in the first cooling chamber, and a second fan configured to generate a second airflow across the second components in the second cooling chamber, where the first airflow and second airflow are isolated from one another by the divider.

In some examples, the housing encloses the wind tunnel and comprises a front panel having a welding interface. In some examples, the first components comprise a first heat sink positioned within a first window of the first secondary portion, and the second components comprise a second heat sink positioned within a second window of the second secondary portion. In some examples, a first electrical module is coupled to the first heat sink and a second electrical module is coupled to the second heat sink, where the first heat sink is configured to dissipate heat produced by the first electrical module and the second heat sink is configured to dissipate heat produced by the second electrical module. In some examples, the welding power supply further comprises one or more circuit boards coupled to at least one of the first electrical module or the second electrical module. In some examples, the welding power supply further comprising a fan cassette coupled to an end of the wind tunnel, wherein the fan cassette houses the first fan and the second fan. In some examples, the first fan is configured to operate at a first speed to generate the first airflow and the second fan is configured to operate at a second speed to generate the second airflow. In some examples, the first speed is set based on a measured, estimated, or predicted thermal output of the first components, and the second speed is set based on a measured, estimated, or predicted thermal output of the second components. In some examples, the first components comprise a first magnetic component coupled to the first primary portion, and wherein the second components comprise a second magnetic component coupled to the second primary portion. In some examples, the first components and the second components are electrical components, and the wind tunnel comprises electrically insulating material so as to electrically insulate the first components from the second components.

Some examples of the present disclosure relate to a wind tunnel for a welding-type power supply. The wind tunnel has a primary section and a secondary section. The primary section and secondary section combine to produce a primary cooling chamber and a secondary cooling chamber. Baffling on the primary and secondary sections define a primary airflow path and a secondary airflow path through the primary cooling chamber and secondary cooling chamber, respectively. A primary fan may be configured to drive air along the primary airflow path, while a secondary fan may be configured to drive air along the secondary cooling path. Primary components may be situated in the primary cooling chamber and/or along the primary cooling path, while secondary components may be situated in the secondary cooling chamber and/or along the primary cooling path. A divider comprising engaged partitions of the primary section and secondary section may separate and/or isolate the primary cooling path from the secondary cooling path. The wind tunnel may comprise an insulating material to provide electrical isolation (e.g., creepage and/or clearance distances) between electrical components.

FIG. 1 shows an example of a welding-type system 10 that may use the example wind tunnel discussed above and/or below. While the specific welding-type system 10 of FIG. 1 is a gas metal arc welding (GMAW) system, other types of welding-type systems may be used. FIG. 1 illustrates the welding-type system 10 as including a welding-type power source 12 coupled to a wire feeder 14. In the illustrated example, the power source 12 is separate from the wire feeder 14, such that the wire feeder 14 may be positioned at some distance from the power source 12 near a welding location. However, it should be understood that the wire feeder 14, in some examples, may be integral with the power source 12. In some examples, the wire feeder 14 may be removed from the system 10 entirely. In some examples, the power source 12 supplies welding-type power to a torch 16 through the wire feeder 14. In some examples, the power source 12 may supply welding-type power directly to the torch 16. In the example of FIG. 1, the wire feeder 14 supplies a wire electrode 18 (e.g., solid wire, cored wire, coated wire) to the torch 16. A gas supply 20, which may be integral with or separate from the power source 12, supplies a gas (e.g., $CO_2$, argon) to the torch 16. In some examples, no gas supply 20 may be used. An operator may engage a trigger 22 of the torch 16 to initiate an arc 24 between the electrode 18 and a work piece 26. In some examples, engaging the trigger 22 of the torch 16 may initiate a different welding-type function, instead of an arc 24.

Figure 2:
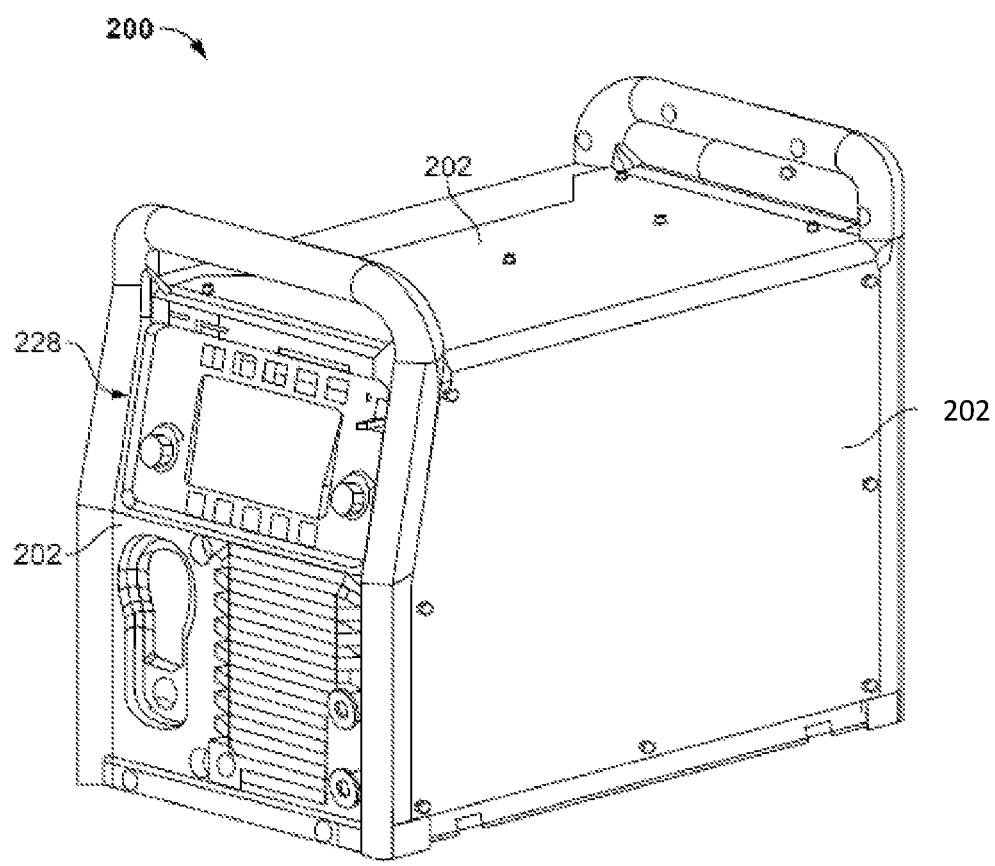
FIG. 2 is a perspective view of an example housing for a welding-type power source, in accordance with aspects of this disclosure.

In some examples, the welding system 10 may receive data settings from the operator via an operator interface 28 provided on the power source 12 (and/or power source housing). In the example of FIG. 2, the operator interface 28 is incorporated into a faceplate 228 of the power source 12 (and/or power source housing), and may allow for selection of settings such as the welding-type process (e.g., stick, TIG, MIG, GMAW), the type of electrode 18 to be used, voltage and current settings, transfer mode (e.g., short circuit, pulse, spray, pulse), and so forth. For example, the welding system 10 may allow for MIG welding (e.g., pulsed MIG welding) with electrodes 18 (e.g., welding wires) of various materials, such as steel or aluminum, to be channeled through the torch 16. The weld settings may be communicated to control circuitry 30 within the power source 12.

In some examples, the control circuitry 30 operates to control generation of welding-type power for carrying out the desired welding-type operation. In the example of FIG. 1, the control circuitry 30 is coupled to the power conversion circuitry 32, which may supply the welding-type power (e.g., pulsed waveform) that is applied to the torch 16. In the example of FIG. 1, the power conversion circuitry 32 is coupled to a source of electrical power as indicated by arrow 34. The source may be a power grid, an engine-driven generator, batteries, fuel cells or other alternative sources. In some examples, the control circuitry 30 may control the current and/or the voltage of the welding-type power supplied to the torch 16. The control circuitry 30 may monitor the current and/or voltage of the arc 24 based at least in part on one or more sensors 36 within the wire feeder 14 and/or torch 16. In some examples, a processor 35 of the control circuitry 30 may determine and/or control the arc length or electrode extension based at least in part on feedback from the sensors 36. The processor 35 may determine and/or control the arc length or electrode extension utilizing data (e.g., algorithms, instructions, operating points) stored in a memory 37. The data stored in the memory 37 may be received via the operator interface 28, a network connection, or preloaded prior to assembly of the control circuitry 30.

FIG. 2 shows an example housing 200 for the example welding-type power source 12. The housing 200 may enclose the control circuitry 30 and/or power conversion circuitry 32. In the example of FIG. 2, the housing 200 includes walls 202 (e.g. sidewalls, end walls, top/bottom walls) that interconnect to substantially enclose the control circuitry 30 and/or power conversion circuitry 32. The housing 200 also includes a faceplate 228 that incorporates the operator interface 28 of the welding-type power source 12. The housing 200 further substantially encloses an example wind tunnel 300, as further described below.

Figure 3:
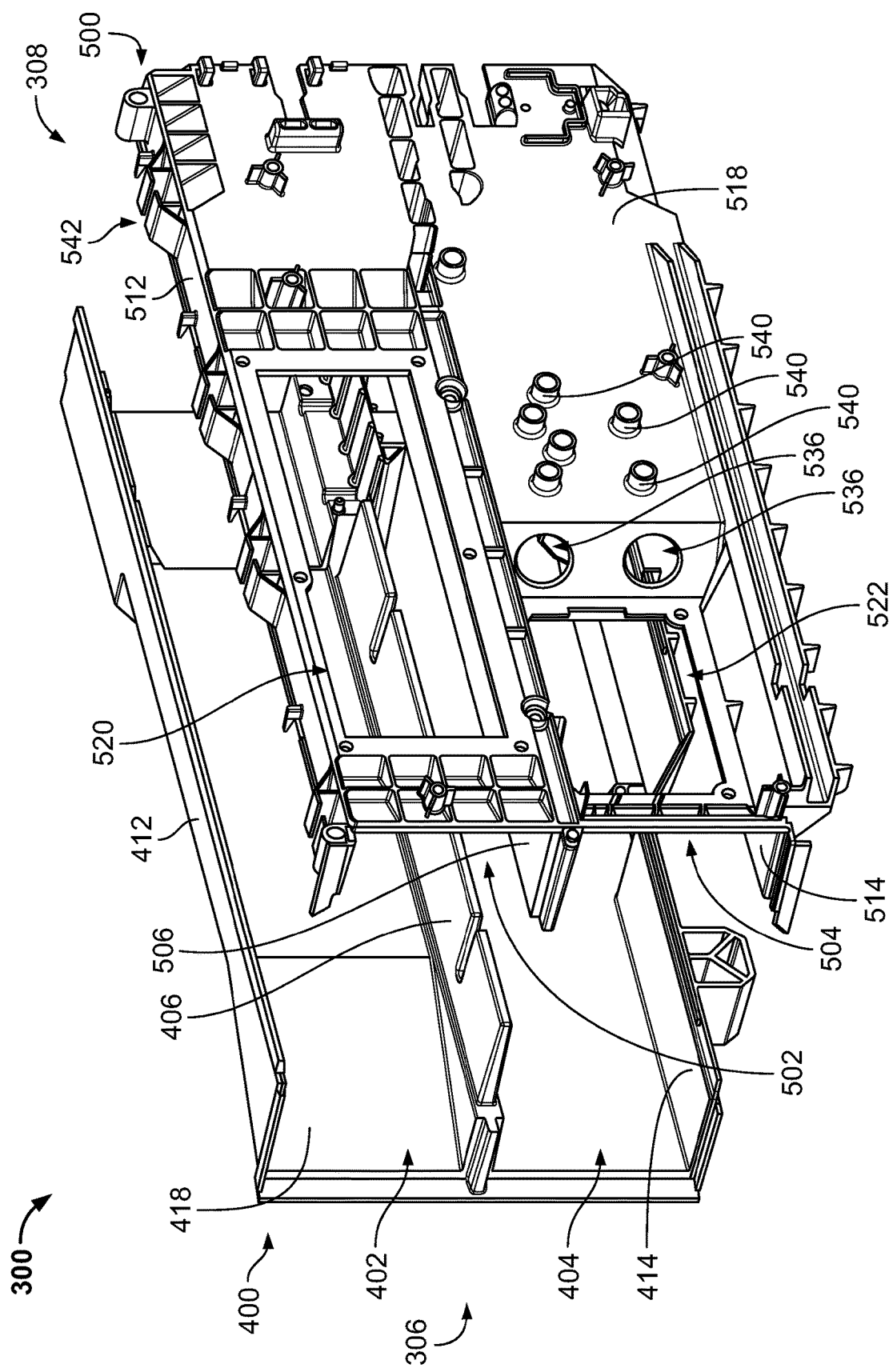
FIG. 3 is an exploded perspective view of an example wind tunnel, in accordance with aspects of this disclosure.
Figure 4:
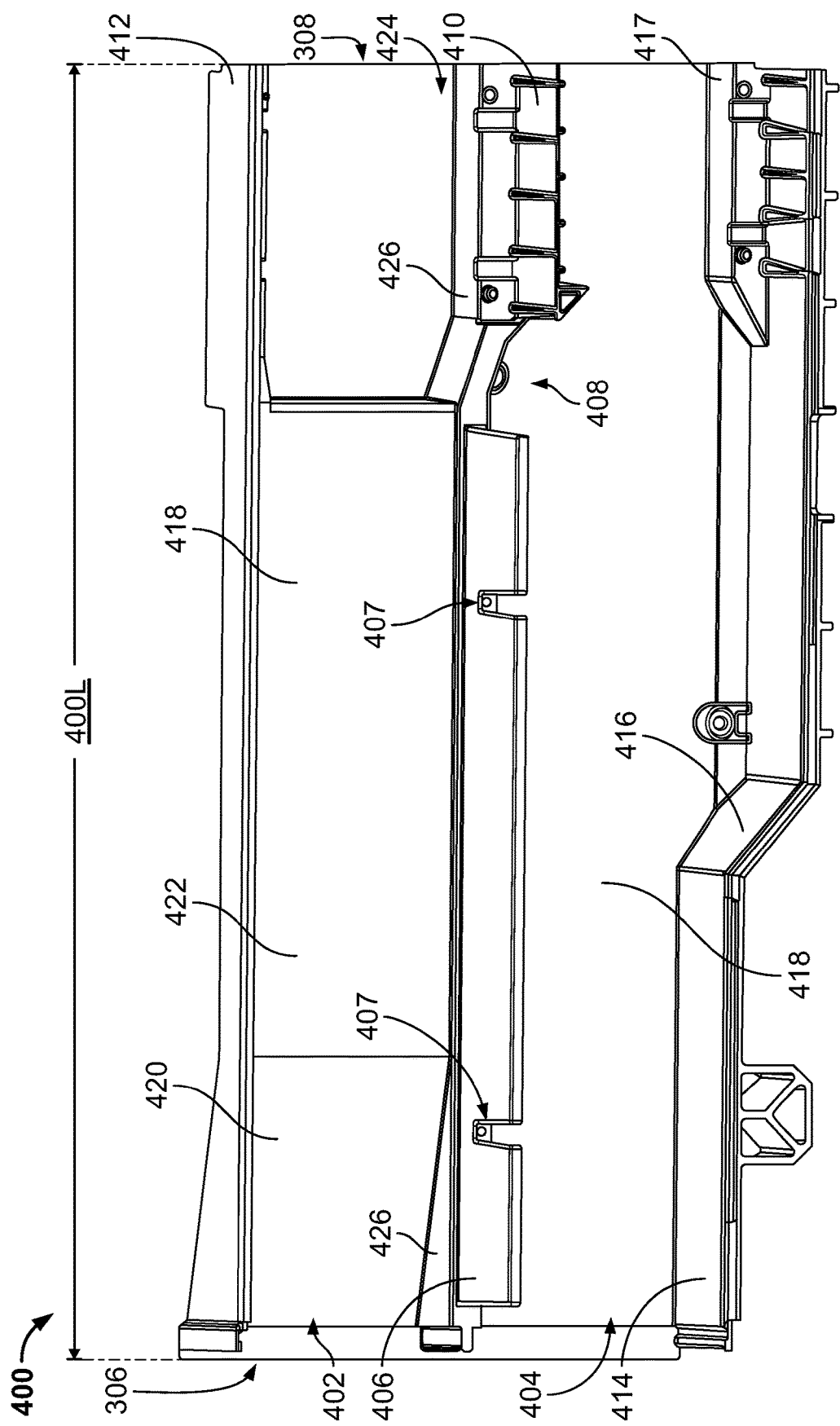
FIG. 4 is an example primary section of the wind tunnel of FIG. 3, in accordance with aspects of this disclosure.

FIG. 3 shows an example wind tunnel 300. In some examples, the wind tunnel 300 may be comprised of an electrically insulating material, such as plastic, for example. In the example of FIG. 3, the wind tunnel 300 is comprised of two separable sections: a primary section 400 and a secondary section 500. Each section comprises approximately half of the wind tunnel 300. FIG. 4 shows an example of the primary section 400. FIG. 5 shows an example of the secondary section 500. In some examples, the wind tunnel 300 may comprise more than two sections, and/or each section may comprise more or less than half the wind tunnel 300. In the example of FIG. 3, the wind tunnel 300 includes a fan end 306 configured for coupling to a fan cassette 700, and a rear end 308 opposite the fan end 306.

In the examples of FIG. 4, the primary section 400 includes a first primary portion 402 and a second primary portion 404. In the examples of FIG. 5, the secondary section 500 includes a first secondary portion 502 and a second secondary portion 504. The primary section 400 and secondary section 500 are configured to be combined to form the wind tunnel 300. More particularly, the first primary portion 402 and first secondary portion 502 combine to form a primary cooling chamber 302, and the second primary portion 404 and the second secondary portion 504 are configured to combine to form the secondary cooling chamber 304. While the primary section 400 and secondary section 500 are shown as being left and right sections, respectively, in some examples, they may switch sides or be arranged vertically (e.g. as top/bottom sections). Likewise, while the primary cooling chamber 302 and secondary cooling chamber 304 are shown as being in a top and bottom configuration, in some examples the chambers vertical positioning may be switched, or the chambers may instead be arranged laterally (e.g. left/right).

The primary section 400 of the wind tunnel 300 includes a primary partition 406. In the example of FIG. 4, the primary partition 406 comprises a substantially flat, planar, and/or continuous piece of material. The primary partition 406 also includes slits 407. The primary partition 406 spans most of the length 400L of the primary section 400, and separates the majority of the first primary portion 402 and second primary portion 404 of the primary section 400. In the examples of FIG. 4, there exists a gap 408 separating the primary partition 406 from a primary support 410. In some examples, there may be no gap 408, and the primary partition 406 (in conjunction with the primary support 410) may instead extend substantially the entire length 400L of the primary section 400, and separate the substantial entirety of the first primary portion 402 and second primary portion 404 of the primary section 400.

The secondary section 500 of the wind tunnel 300 includes a secondary partition 506. In the example of FIG. 5, the secondary partition 506 spans substantially the entire length 500L of the secondary section 500. The secondary partition 506 separates the first secondary portion 502 and the second secondary portion 504 of the secondary section 500. Much of the secondary partition 506 includes a channel 507 configured to receive the primary partition 406. The secondary partition 506 also includes a sloped area 508 configured to fit within the gap 408 of the primary partition 406. The secondary section 500 further includes a secondary support 510. The primary support 410 is configured to fit between the secondary partition 506 and the secondary support 510.

In the example of FIG. 3, the primary partition 406 and secondary partition 506 are configured to engage when the primary section 400 and secondary section 500 are joined together. In particular, when the primary section 400 and secondary section 500 are joined together, the primary partition 406 fits within the channel 507 of the secondary partition 506. Thus, when the primary section 400 and secondary section 500 are joined together, one side of the secondary partition 506 forms a floor of the primary cooling chamber 302, while the other side forms a roof of the secondary cooling chamber 304 (see, e.g., FIG. 8). Additionally, when the primary section 400 and secondary section 500 are joined together, the sloped area 508 of the secondary partition 506 fills the gap 408 in the primary partition 406. Further, when the primary section 400 and secondary section 500 are joined together, the primary support is sandwiched between the secondary partition 506 and the secondary support 510. When engaged, the primary partition 406 and secondary partition 506 comprise a divider separating the primary cooling chamber 302 from the secondary cooling chamber 304, as shown, for example, in FIG. 8. In some examples, the divider may further comprise the primary support 410 and/or secondary support 510.

In the example of FIG. 4, the primary section 400 includes a first primary end wall 412 and a second primary end wall 414. The first primary end wall 412 and second primary end wall 414 are separated by and/or positioned on opposite sides of the primary partition 406. The first primary end wall 412 is spaced from the primary partition 406 at substantially the same distance along its entire primary length 400L. The second primary end wall 414 has a primary ramp 416 that changes the distance of the second primary end wall 414 to the primary partition 406. Because of the ramp 416, the distance from the second primary end wall 414 to the primary partition 406 is larger at the portion of the second primary end wall 414 between the ramp 416 and a rear end 308 of the primary section 400, than at the portion of the second primary end wall 414 between the ramp 416 and the fan end 306 of the primary section 400. The second primary end wall 414 further includes a primary embankment 417 proximate the rear end 308.

The first primary end wall 412 and second primary end wall 414 are connected to a primary sidewall 418 that spans the primary partition 406. The primary sidewall 418 comprises baffling to direct air flow within the primary cooling chamber 302. The baffling on the primary sidewall 418 in the first primary portion 402 of the primary section 400 comprises an angled portion 420, a parallel portion 422, and a recessed portion 424. The angled portion 420 slopes towards the primary partition 406 as it travels from a fan end 306 of the primary section 400, towards the parallel portion 422. The parallel portion 422 extends substantially straight from the angled portion 420 to the recessed portion 424. The recessed portion 424 comprises an alcove formed in the primary sidewall 418. At the recessed portion 424, the primary sidewall 418 forms a ninety degree angle with the primary sidewall 418 of the parallel portion 422. A primary center wall 426 is exposed by the both the angled portion 420 and the recessed portion 424. The baffling on the primary sidewall 418 in the second primary portion 404 of the primary section 400 comprises a single straight section along the entire primary length 400L.

In the example of FIG. 5, the secondary section 500 includes a first secondary end wall 512 and a second secondary end wall 514 separated by and/or positioned on opposite sides of the secondary partition 506. The first secondary end wall 512 is spaced from the secondary partition 506 at substantially the same distance along its entire secondary length 500L. The second secondary end wall 514 has a secondary ramp 516 that changes the distance of the second secondary end wall 514 to the secondary partition 506. Because of the ramp 516, the distance from the second secondary end wall 514 to the secondary partition 506 is larger at the portion of the second secondary end wall 514 between the secondary ramp 516 and a rear end 308 of the secondary section 500, than at the portion of the second secondary end wall 514 between the secondary ramp 516 and the fan end 306 of the secondary section 500. The second secondary end wall 514 further includes a secondary embankment 517 proximate the rear end 308 of the secondary section 500.

Figure 8:
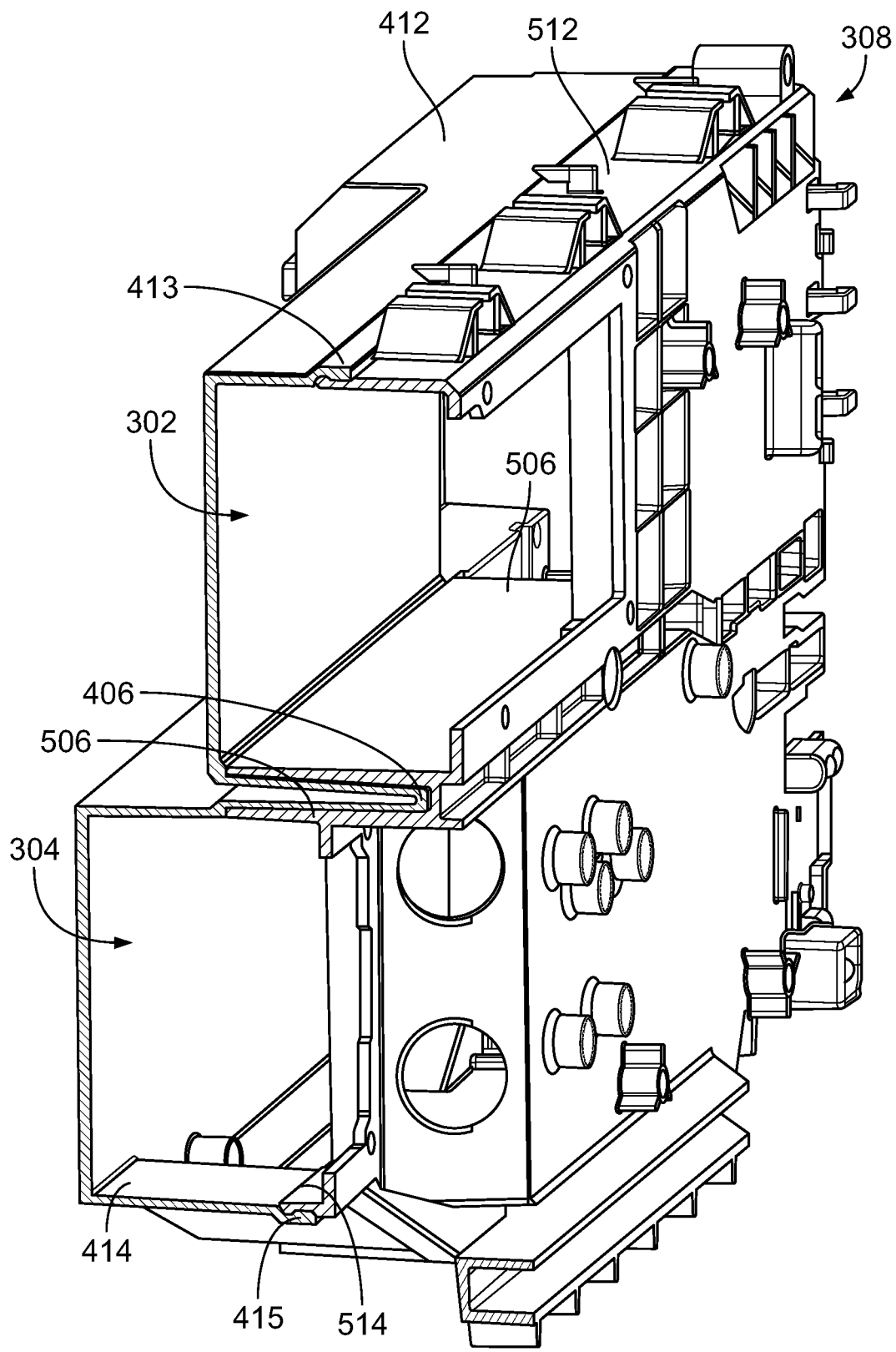
FIG. 8 is a partial cross sectional view of the example wind tunnel of FIG. 3, along the line 8-8 in FIG. 7, in accordance with aspects of this disclosure.

In the example of FIGS. 3-5, the primary length 400L and secondary length 500L of the primary section 400 and secondary section 500 are approximately equal. The length of the secondary ramp 516 is also approximately equal to the length of the primary ramp 417. The profiles of the second primary end wall 414 and the second secondary end wall 514, are also approximately the same, such that the secondary ramp 516 and primary ramp 417 come together when the primary section 400 is coupled to the secondary section 500. The profiles of the first primary end wall 412 and first secondary end wall 512 are also approximately the same. In the example of FIG. 8, the first primary end wall 412 includes a first lip 413 that snaps over the first secondary end wall 512 to help couple together the primary section 400 and secondary section to form the wind tunnel 300. The second primary end wall 414 includes a second lip 415 that snaps over the second secondary end wall 514 to help couple together the primary section 400 and secondary section to form the wind tunnel 300.

The secondary section 500 also includes baffling. The first secondary end wall 512 and second secondary end wall 514 are connected to a secondary sidewall 518 that comprises baffling to direct air flow within the first secondary portion 502 and second secondary portion 504 of the secondary section 500. Within the first secondary portion 502, the secondary sidewall 518 comprises a first sloped portion 524, a second sloped portion 526, a first recessed portion 528, and parallel portions 530. The first sloped portion 524 slopes towards the secondary partition 506 as it extends from a fan end 306 of the secondary section 500, towards the first recessed portion 528. At the first recessed portion 528, the secondary sidewall 518 forms a ninety degree angle with the secondary sidewall 518 of the first sloped portion 524. Thereafter, the secondary sidewall 518 comprises a parallel portion 530 that eventually forms another ninety degree angle to complete the profile of the first recessed portion 528. A primary window 520 is also formed in parallel portion 530 of the secondary sidewall 518 within the first recessed portion 528, and between the two ninety degree angles. The secondary sidewall 518 comprises another parallel portion 530 between the first recessed portion 528 and the second sloped portion 526. The second sloped portion 526 slopes away from the secondary partition 506 as the second sloped portion 526 extends from the parallel portion towards the rear end 308 of the wind tunnel 300. The secondary sidewall 518 forms a final parallel portion 530 between the second sloped portion 526 and the rear end 308 of the wind tunnel 300.

Within the second secondary portion 504, the secondary sidewall 518 comprises a third sloped portion 532 and a fourth sloped portion 534. A second recessed portion 538 is formed between the third sloped portion 532 and a fourth sloped portion 534. The third sloped portion 532 slopes towards the secondary partition 506 as it extends from a fan end 306 of the secondary section 500 towards the second recessed portion 538. At the second recessed portion 538, the secondary sidewall 518 forms a ninety degree angle with the secondary sidewall 518 of the third sloped portion 532. Thereafter, the secondary sidewall 518 comprises a parallel portion 530 that eventually forms another ninety degree angle to complete the profile of the second recessed portion 538. A secondary window 522 is formed in the parallel portion 530 of the secondary sidewall 518 within the second recessed portion 538. The fourth sloped portion 534 slopes away from the secondary partition 506 as the fourth sloped portion 534 extends from the second recessed portion 538 towards the rear end 308 of the secondary section 500. Two aligned circular apertures 536 are formed in the fourth sloped portion 534. The secondary sidewall 518 forms another parallel portion 530 between the fourth sloped portion 534 and the rear end 308.

FIGS. 6a and 6b show a top plan view and bottom plan view, respectively, of the wind tunnel 300 with the primary section 400 and secondary section 500 coupled together. The darkened lines 600 show the baffling of the primary sidewall 418 and secondary sidewall 518 in the primary section 400 and secondary section 500. In the example of FIG. 6a, the lines 600 show baffling in the primary cooling chamber 302. In the example of FIG. 6b, the lines 600 show baffling in the secondary cooling chamber 304. The first primary end wall 412 and first secondary end wall 512 may also be considered baffling in the primary cooling chamber 302. Likewise, the second primary end wall 414 and second secondary end wall 514 may be considered baffling in the secondary cooling chamber 304. The baffles of the primary cooling chamber 302 and secondary cooling chamber 304 define a primary airflow path and a secondary airflow path, respectively, within the primary cooling chamber 302 and secondary cooling chamber 304.

FIG. 7 shows the example assembled wind tunnel 300 engaged to a fan cassette 700 at the fan end 306 (and/or front end) of the wind tunnel 300. The fan end 306 of the wind tunnel 300 is configured to engage the fan cassette 700 so as to retain the fan cassette 700 securely on the wind tunnel 300. The fan cassette 700 is similarly configured to engage the fan end 306 of the wind tunnel 300. In some examples, it may be convenient to use a fan cassette 700 for relative ease of exchangeability. For example, an operator may be able to swap one fan cassette 700 (having one or more fans with a certain size, speed, and/or configuration) with another fan cassette 700 (having one or more fans with a different size, speed, and/or configuration) with few (if any) tools and little difficulty. In some examples, it may be more difficult to exchange fans that directly are installed in the wind tunnel 300 without a fan cassette 700.

In the example of FIG. 7, the fan cassette 700 includes a primary fan 702 and a secondary fan 704. The primary fan 702 is configured to generate (and/or drive) airflow along the primary cooling path within the primary cooling chamber 302. The secondary fan 704 is configured to generate (and/or drive) airflow along the secondary cooling path within the secondary cooling chamber 304. The primary fan 702 and/or secondary fan 704 may be configured to blow air from the fan end 306 towards the rear end 308 and/or suction air from the rear end 308 towards the fan end 306. In some examples, the primary fan 702 may blow air while the secondary fan 704 suctions air, or vice versa. In some examples, the fan cassette 700 may include only a primary fan 702. In such an example, the primary fan 702 may generate airflow along the primary cooling path within the primary cooling chamber 302 and the secondary cooling path within the secondary cooling chamber 304, or just one or the other. In some examples, the primary fan 702 and/or secondary fan 704 may actually comprise more than one fan (e.g. 2 fans, 3 fans, 4 fans, etc.). In some examples, the primary fan 702 and/or secondary fan 704 may be individually secured onto and/or within the primary cooling chamber 302 and/or secondary cooling chamber 304 of the wind tunnel 300 without aid of the fan cassette 700. In some examples the primary fan 702 and/or secondary fan 704 are powered by the source of electrical power 34. In some examples the primary fan 702 and/or secondary fan 704 may be powered by a different source of power.

The divider of the wind tunnel 300 is configured to separate and/or isolate the primary cooling chamber 302 (and/or primary airflow path) from the secondary cooling chamber 304 (and/or secondary airflow path). Thus, the airflow generated by the primary fan 702 in the primary cooling chamber 302 may be different than the airflow generated by the secondary fan 704 in the secondary cooling chamber, without either airflow impacting the other. Components of the power source 12 may be mounted to and/or positioned on and/or within the wind tunnel 300 to be cooled by the airflow(s).

Figure 9:
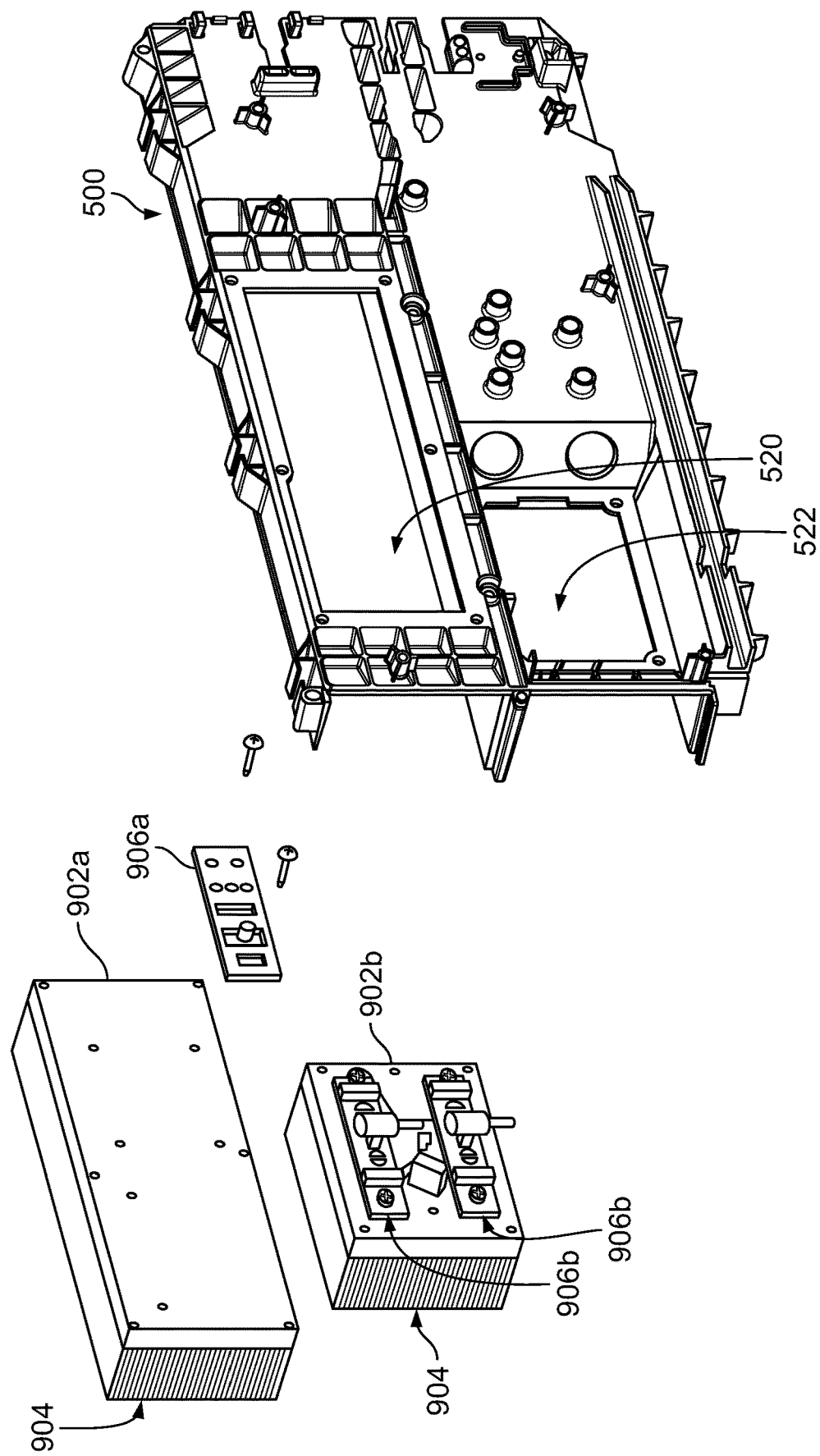
FIG. 9 is an perspective view of the example wind tunnel secondary section of FIG. 5 showing an arrangement of associated heat sinks, in accordance with aspects of this disclosure.
Figure 10:
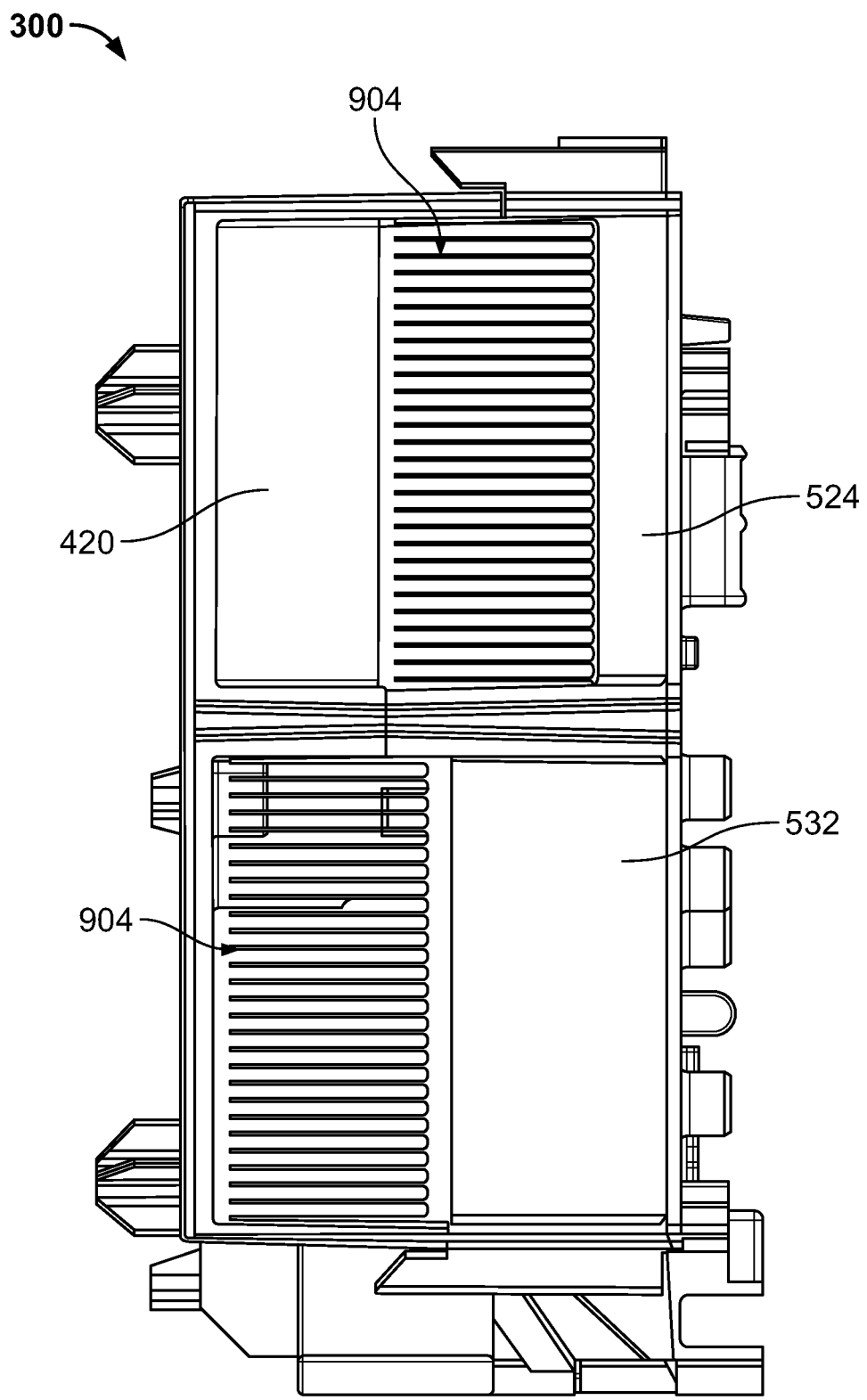
FIG. 10 is a rear plan view of the example wind tunnel of FIG. 3 with heat sinks attached, in accordance with aspects of this disclosure.

As shown in the example of FIG. 9, the primary window 520 and secondary window 522 are configured to receive a primary heatsink 902a and a secondary heatsink 902b, respectively. In the example of FIG. 9, the primary heatsink 902a is larger than the secondary heatsink 902b. The heatsinks 902 may be coupled to the secondary section 500 proximate the primary window 520 and secondary window 522 using appropriate fasteners (e.g. screws, bolts, etc.). In the example of FIG. 9, the primary heatsink 902a and secondary heatsink 902b have protruding fins 904 that extend into the primary cooling chamber 302 and secondary cooling chamber 304, respectively. The fins 904 provide more surface area from which heat may dissipate, which helps with the thermal dissipation. In the example of FIGS. 8-10, the primary window 520 and secondary window 522 are offset from one another, such that fins 904 of the primary heatsink 902a and secondary heatsink 902b are likewise offset from one another within the wind tunnel 300. When airflow from the fans 702, 704 flow across the fins 904, it helps to dissipate heat accumulated in the heatsinks 902.

In the example of FIG. 9, the heatsinks 902 are configured to receive modules 906. More particularly, the primary heatsink 902a is configured to receive one or more primary modules 906a, and the secondary heatsink 902b is configured to receive one or more secondary modules 906b. In the example of FIG. 9, the modules 906 comprise electrical components (e.g. transistors, resistors, other electric circuitry, etc.) that generate non-trivial amounts of heat. The modules 906 may comprise some or all of the control circuitry 35 and/or power conversion circuitry 32. The modules 906 are coupled to the heatsinks 902 such that the heatsinks 902 are in thermal communication with the modules 906. Thus, heat generated by the modules 906 is conducted to the heatsinks 902, and to the fins 904 of the heatsinks 902. Airflow generated by the fans 702, 704 may flow across the heatsinks 902 to dissipate the heat generated by the modules 906.

Figure 11A:
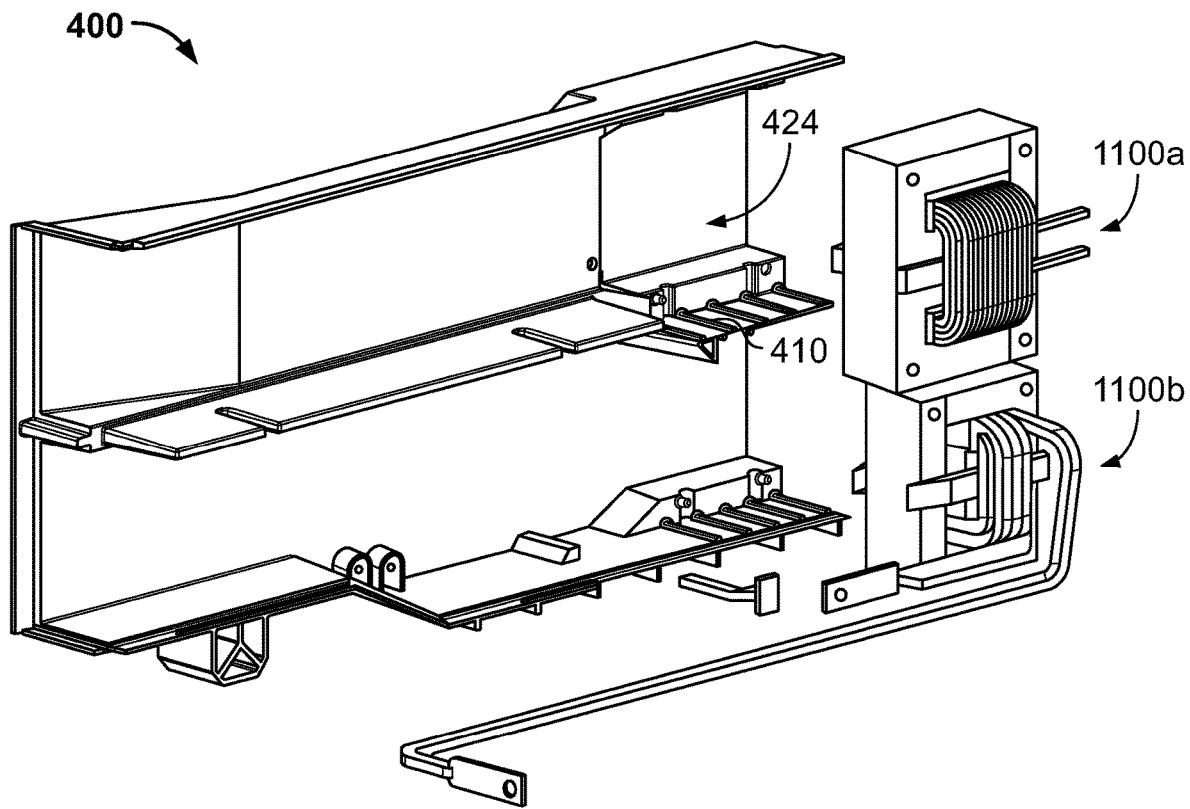
FIG. 11a is a perspective view of the example wind tunnel primary section of FIG. 4 showing an arrangement of associated inductors, in accordance with aspects of this disclosure.
Figure 11B:
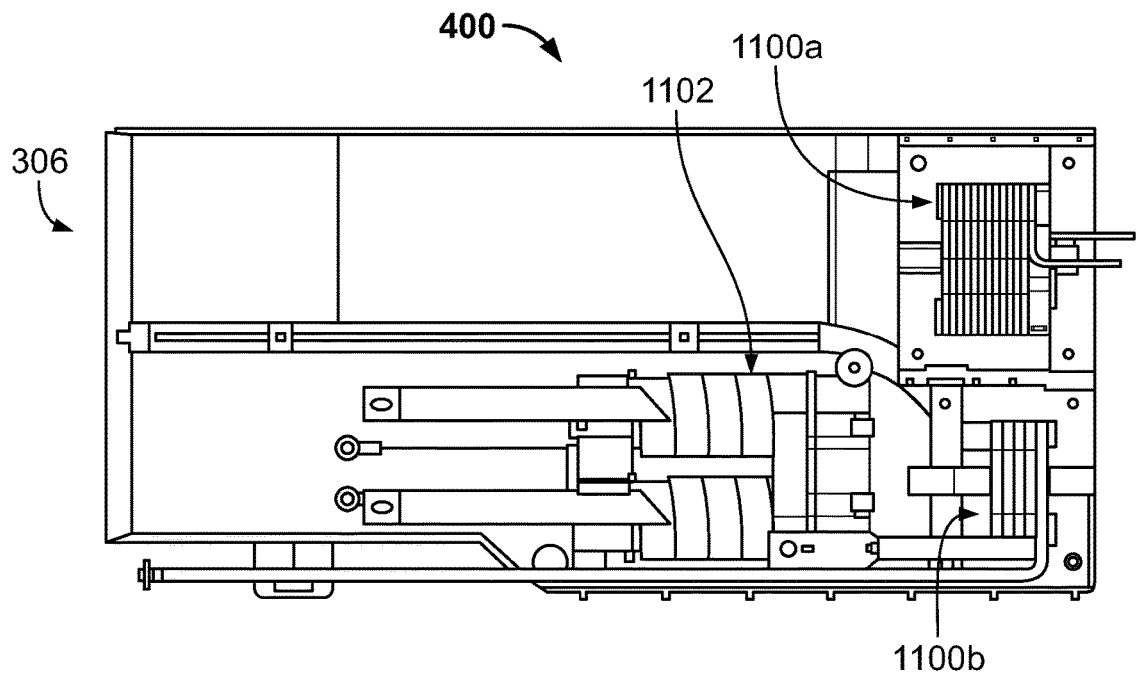
FIG. 11b is a side plan view of the example wind tunnel primary section of FIG. 4 showing an arrangement of associated inductors, in accordance with aspects of this disclosure.

In the example of FIGS. 11a and 11b, magnetic components are positioned in and/or mounted to the primary section 400 of the wind tunnel 300. In particular, inductors 1100 are positioned in and/or mounted to the primary section 400 of the wind tunnel 300, towards the rear end 308 of the wind tunnel 300. A primary inductor 1100a (e.g. input inductor) is positioned in and/or mounted proximate to the recessed portion 424 of the primary section 400, above the primary support 410. A secondary inductor 1100b (e.g. output inductor) is positioned in and/or mounted in the second primary portion 404 of the primary section 400, below the primary support 410. A transformer 1102 is positioned in the second primary portion 404 of the primary section 400 adjacent the secondary inductor 1100b. The inductors 1100 and/or transformer 1102 may comprise some of the control circuitry 30 and/or power conversion circuitry 32.

Figure 12B:
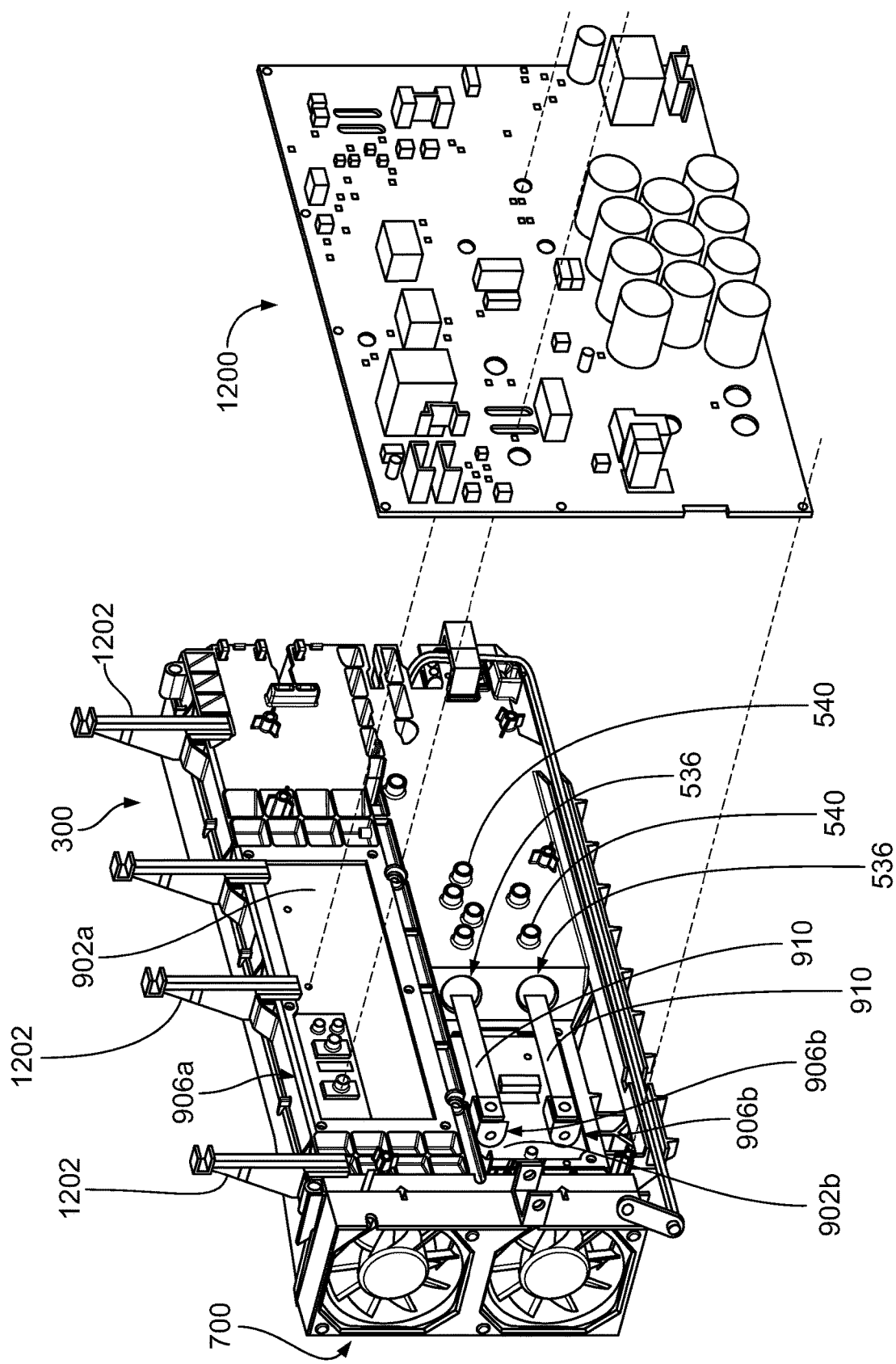
FIG. 12b is a perspective view of the example wind tunnel of FIG. 3 showing an arrangement of an associated circuit board, in accordance with aspects of this disclosure.

FIGS. 12*a* and 12*b* show an assembled example wind tunnel 300 with the heatsinks 902 attached, and the modules 906 attached to the heatsinks. Conductors 910 (e.g. bus bars) in electrical communication with the secondary modules 906*b* extend through the apertures 536 to connect with the transformer 1102. The primary modules 906*a* is further configured to receive and/or couple to a circuit board 1200. Conductive fasteners electrically couple the circuit board 1200 to the primary module 906*a*. Additional modules (not shown) positioned on a back side of the circuit board 1200 may also couple the circuit board 1200 to the heat sink 902*a*. In some examples, one or more other circuit boards may be coupled to the secondary modules 906*b*.

The secondary section 500 is also configured to receive and/or couple to the circuit board 1200. In the example of FIGS. 12*a* and 12*b*, the secondary section 500 includes spacers 540 configured to space the wind tunnel 300 from the circuit board 1200 (e.g. for electrical and/or thermal isolation purposes, as well as stability). The first secondary end wall 512 of the secondary section 500 also includes holders 542 configured to receive brackets 1202 that help to couple the circuit board to the wind tunnel 300. The circuit board 1200 may include electrical circuitry (e.g. capacitors, transistors, etc.) comprising some or all of the control circuitry 35 and/or power conversion circuitry 32.

In operation, the modules 906, inductors 1100, transformer 1102, and/or circuit board 1200 may generate heat when using electrical power. Heat from the modules may be conducted to the heatsinks 902. The heatsinks 902, transformer 1102, and/or the inductors 1100 lie within the airflow paths of the wind tunnel 300. The primary fan 702 and/or secondary fan 704 may be powered by the same source of electrical power (or a different source of electrical power) to generate airflow within the wind tunnel, which may help cool the heatsinks 902, transformer 1102, and/or inductors 1100, and/or dissipate heat from the heatsinks 902, transformer 1102, and/or inductors 110. In some examples, the speed of the fans 702, 704 may be controlled by the control circuitry 30 based on a measured, detected, predicted, and/or estimated amount of heat generated by the transformer 1102, inductors 1100 and/or modules 906. In some examples, the speed of the primary fan 702 may be controlled to be different than the speed of the secondary fan 704 in response to a measurement, detection, prediction and/or estimation of more or less heat being in the primary cooling chamber 302 than in the secondary cooling chamber 304. In some examples, one or more thermal sensors may be positioned in and/or proximate the primary cooling chamber 302 and/or secondary cooling chamber 304, and/or otherwise positioned proximate the transformer 1102, inductors 1100, and/or modules 906. The thermal sensors may measure and/or detect heat within the primary cooling chamber 302 and/or secondary cooling chamber 304. The control circuitry 30 may estimate and/or predict heat within the primary cooling chamber 302 and/or secondary cooling chamber 304 based on the measurements and/or detections of the thermal sensors.

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A power supply enclosure, comprising:
   a housing; and
   a wind tunnel disposed within the housing, comprising:
   a primary section having a first primary portion and a second primary portion separated by a primary partition, and
   a secondary section having a first secondary portion and a second secondary portion separated by a secondary partition,
   wherein when the primary partition engages the secondary partition to couple the primary section to the secondary section, the first primary portion and first secondary portion combine to define a first cooling chamber, and the second primary portion and second secondary portion combine to define a second cooling chamber that is separated from the first cooling chamber by a divider comprising the engaged primary partition and secondary partition.

2. The power supply enclosure of claim 1, wherein the wind tunnel further comprises a first end coupled to a fan cassette, wherein the fan cassette comprises a first fan configured to generate airflow in the first cooling chamber and a second fan configured to generate airflow in the second cooling chamber.

3. The power supply enclosure of claim 1, wherein the first cooling chamber comprises an airflow path between the first primary portion and the first secondary portion.

4. The power supply enclosure of claim 1, wherein the second cooling chamber comprises an airflow path between the second primary portion and the second secondary portion.

5. The power supply enclosure of claim 1, wherein the first cooling chamber and second cooling chamber are axially offset from one another proximate a window of the second cooling chamber.

6. The power supply enclosure of claim 1, wherein the secondary partition comprises a channel, and wherein at least a portion of the primary partition is positioned within the channel when the primary partition and the secondary partition are engaged.

7. The power supply enclosure of claim 6, wherein the secondary partition defines at least a portion of the first cooling chamber and second cooling chamber when the first partition and the second partition are engaged.

8. The power supply enclosure of claim 1, wherein the wind tunnel further comprises baffling configured to direct air flow within at least one of the first cooling chamber or the second cooling chamber.

9. The power supply enclosure of claim 1, wherein the first secondary portion comprises a window configured to accept a heat sink.

10. The power supply enclosure of claim 1, wherein the second secondary portion comprises a window configured to accept a heat sink.

11. A welding power supply, comprising:
    a housing; and
    a wind tunnel disposed within the housing, wherein the wind tunnel, comprises:

a primary section having a first primary portion and a second primary portion separated by a primary partition, a secondary section having a first secondary portion and a second secondary portion separated by a secondary partition, a first cooling chamber defined by the first primary portion, the first secondary, and a divider comprising the primary partition engaged to the secondary partition, and a second cooling chamber defined by the second primary portion, the second secondary portion, and the divider;

first components positioned within the first cooling chamber;

second components positioned within the second cooling chamber;

a first fan configured to generate a first airflow across the first components in the first cooling chamber; and a second fan configured to generate a second airflow across the second components in the second cooling chamber, wherein the first airflow and second airflow are isolated from one another by the divider.

12. The welding power supply of claim 11, wherein the housing encloses the wind tunnel and comprises a front panel having a welding interface.

13. The welding power supply of claim 11, wherein the first components comprise a first heat sink positioned within a first window of the first secondary portion, and wherein the second components comprise a second heat sink positioned within a second window of the second secondary portion.

14. The welding power supply of claim 13, wherein a first electrical module is coupled to the first heat sink and a second electrical module is coupled to the second heat sink, wherein the first heat sink is configured to dissipate heat produced by the first electrical module and the second heat sink is configured to dissipate heat produced by the second electrical module.

15. The welding power supply of claim 14, further comprising one or more circuit boards coupled to at least one of the first electrical module or the second electrical module.

16. The welding power supply of claim 11, further comprising a fan cassette coupled to an end of the wind tunnel, wherein the fan cassette houses the first fan and the second fan.

17. The welding power supply of claim 11, wherein the first fan is configured to operate at a first speed to generate the first airflow and the second fan is configured to operate at a second speed to generate the second airflow.

18. The welding power supply of claim 17, wherein the first speed is set based on a measured, estimated, or predicted thermal output of the first components, and the second speed is set based on a measured, estimated, or predicted thermal output of the second components.

19. The welding power supply of claim 11, wherein the first components comprise a first magnetic component coupled to the first primary portion, and wherein the second components comprise a second magnetic component coupled to the second primary portion.

20. The welding power supply of claim 11, wherein the first components and the second components are electrical components, and wherein the wind tunnel comprises electrically insulating material so as to electrically insulate the first components from the second components.

* * * * *